United States Patent
Sun et al.

(10) Patent No.: US 9,006,638 B2
(45) Date of Patent: Apr. 14, 2015

(54) DUAL-MODE CAPACITIVE TRANSIMPEDANCE AMPLIFIER, AND READ-OUT DEVICE INCORPORATING THE SAME

(75) Inventors: Tai-Ping Sun, Taoyuan County (TW); Yi-Chuan Lu, Kinmen County (TW); I-Tin Liu, Yunlin County (TW)

(73) Assignee: National Chi Nan University (TW)

( * ) Notice: Subject to any disclaimer, the term of this patent is extended or adjusted under 35 U.S.C. 154(b) by 505 days.

(21) Appl. No.: 13/443,315

(22) Filed: Apr. 10, 2012

(65) Prior Publication Data

US 2013/0106505 A1    May 2, 2013

(30) Foreign Application Priority Data

Oct. 28, 2011  (TW) .............................. 100139373 A

(51) Int. Cl.
| | |
|---|---|
| H03F 3/08 | (2006.01) |
| H01J 40/14 | (2006.01) |
| H03K 17/78 | (2006.01) |
| H03F 11/00 | (2006.01) |

(52) U.S. Cl.
CPC ...................................... *H03F 3/08* (2013.01)

(58) Field of Classification Search
CPC ..... H01L 27/14; H01L 27/142; H01L 27/144; H01L 27/146; H01L 27/14601; H01L 27/14603; H01L 27/14605; H01L 27/14609; H01L 27/1461; H01L 27/14612; H01L 27/14614; H01L 27/14636; H01L 27/14638; H01L 27/14643; H01L 27/14645; H01L 27/14649; H04N 1/56; H04N 5/225; H04N 5/2251; H04N 5/2257; H04N 5/2258; H04N 5/232; H04N 5/341; H04N 5/345; H04N 5/369; H04N 5/3692; H04N 5/3696; H04N 5/3698; H04N 5/372; H04N 5/37206; H04N 5/37213; H04N 5/3722; H04N 5/3725; H04N 5/3728; H04B 2210/003; H03F 1/00; H03F 1/08; H03F 1/082
USPC ..... 250/208.1, 214 R, 214.1, 214 SW, 214 A; 330/7; 348/294–324, 332; 257/414, 257/428, 431–466
See application file for complete search history.

(56) References Cited

U.S. PATENT DOCUMENTS

| | | | | |
|---|---|---|---|---|
| 4,929,913 | A | * | 5/1990 | Sato .............................. 330/308 |
| 6,038,049 | A | * | 3/2000 | Shimizu et al. ............... 398/210 |
| 6,121,834 | A | | 9/2000 | Kim |
| 6,121,843 | A | | 9/2000 | Vampola ....................... 330/308 |
| 7,492,399 | B1 | | 2/2009 | Gulbransen ................... 348/294 |
| 8,258,451 | B2 | * | 9/2012 | Vampola et al. .......... 250/214 A |
| 2005/0194520 | A1 | * | 9/2005 | Koseki ................... 250/214 AG |
| 2010/0026393 | A1 | * | 2/2010 | Keerti et al. .................. 330/302 |

FOREIGN PATENT DOCUMENTS

| | | |
|---|---|---|
| JP | S63-160353 | 7/1988 |
| WO | WO 2010/135709 A1 | 11/2010 |

OTHER PUBLICATIONS

Chinese Search Report, dated Dec. 24, 2014, issued in corresponding Chinese Patent Application No. 2011104288476. English translation. Total 4 pages.

* cited by examiner

*Primary Examiner* — Pascal M Bui Pho
(74) *Attorney, Agent, or Firm* — Ostrolenk Faber LLP

(57) ABSTRACT

A capacitive transimpedance amplifier for a detector unit capable of generating first and second detection currents comprises: a read-out circuit including an integration capacitor coupled between an input node connected to the detector unit, and a common node between first and second transistors connected in series, and a sampling and holding unit coupled between the first common node and an output node for sampling and holding a voltage at the first common node; and a switch unit connected to control ends of the first and second transistors and the input node, and operable between a first state, where the first detection current is read out, and a second state, where the second detection current is read out.

15 Claims, 6 Drawing Sheets

DUAL-MODE CAPACITIVE TRANSIMPEDANCE AMPLIFIER, AND READ-OUT DEVICE INCORPORATING THE SAME

CROSS-REFERENCE TO RELATED APPLICATION

This application claims priority to Taiwanese Application No. 100139373, filed on Oct. 28, 2011.

BACKGROUND OF THE INVENTION

1. Field of the Invention

The invention relates to an amplifier, and more particularly to a dual-mode capacitive transimpedance amplifier, and a read-out device incorporating the same.

2. Description of the Related Art

FIG. 1 illustrates a conventional capacitive trans impedance amplifier 1 disclosed in U.S. Pat. No. 6,121,834. The conventional capacitive transimpedance amplifier 1 is used to integrate a detection current, which is generated from a radiation detector in response to light signals, such as infrared signals, for a specified period of time, referred to as the integration time, thereby outputting an output voltage ($V_{OUT}$) proportional to the detection current. The radiation detector is a photovoltaic diode (D), which is an N-on-P typed detector receiving a reference bias ($V_{COM}$) at a cathode thereof. The conventional capacitive transimpedance amplifier 1 includes a transistor (M1), a first capacitor (C1), a second capacitor (C2), a third capacitor (C3), a first switch (SW1), a second switch (SW2), and a third switch (SW3).

The transistor (M1) has a gate coupled to an anode of the photovoltaic diode (D), a drain and a source. The first capacitor (C1) is coupled between the drain and the gate of the transistor (M1). The second capacitor (C2) is coupled between the source of the transistor (M1) and ground. The third capacitor (C3) is coupled between the drain of the transistor (M1) and ground. The conventional capacitive transimpedance amplifier 1 has an open loop gain equal to a ratio of the capacitance of the second capacitor (C2) to the capacitance of the third capacitor (C3). The first capacitor (C1) is charged by the detection current from the photovoltaic diode (D) such that the output voltage ($V_{OUT}$) proportional to a product of the detection current and the integration time is generated.

The first switch (SW1) has a first end 11 receiving a first voltage ($V_{DD}$), and a second end 12 coupled to the drain of the transistor (M1), and is controlled to switch between an ON-state, where the first and second ends 11, 12 are connected to each other, and an OFF-state, where the first end 11 disconnects the second end 12. The second switch (SW2) has a first end 13 receiving a reset voltage ($V_{RESET}$) and a second end 14 coupled to the gate of the transistor (M1) and the anode of the photovoltaic diode (D), and is controlled to switch between an ON-state, where the first and second ends 13, 14 are connected to each other, and an OFF-state, where the first end 13 disconnects the second end 14. The third switch (SW3) has a first end 15 coupled to the drain of the transistor (M1), and a second end 16 for outputting the output voltage ($V_{OUT}$).

However, the conventional capacitive transimpedance amplifier 1 is only adapted to read out the detection current generated from the N-on-P type detector, but cannot read out a detection current generated from a P-on-N type detector. Therefore, improvements may be made to the above techniques.

SUMMARY OF THE INVENTION

Therefore, an object of the present invention is to provide a dual-mode capacitive transimpedance amplifier, and a read-out device incorporating the same that can overcome the aforesaid drawbacks of the prior art.

According to one aspect of the present invention, there is provided a dual-mode capacitive transimpedance amplifier for a detector unit capable of generating first and second detection currents flowing respectively in opposite directions. The capacitive transimpedance amplifier of the present invention comprises:

a read-out circuit having an input node adapted to be connected electrically to the detector unit, and an output node, and including an integration capacitor having a first end coupled to the input node, and a second end, first and second transistors adapted to be connected in series between first and second reference potentials, a first common node between the first and second transistors being coupled to the second end of the integration capacitor, each of the first and second transistors having a control end, and a sampling and holding unit coupled between the first common node and the output node for sampling and holding a voltage at the first common node; and a switch unit adapted to be connected between third and fourth reference potentials, and connected electrically to the control ends of the first and second transistors and the input node of the read-out circuit.

The switch unit is operable between a first state, where the control ends of the first and second transistors is coupled respectively to the input node and the fourth reference potential through the switch unit such that the first detection current from the detector unit is read out by the read-out circuit, and a second state, where the control ends of the first and second transistors are coupled respectively to the third reference potential and the input node through the switch unit such that the second detection current from the detector unit is read out by the read-out circuit.

According to another aspect of the present invention, a read-out device comprises:

a detector unit capable of generating first and second detection currents flowing respectively in opposite directions;

a read-out circuit having an input node connected electrically to the detector unit, and an output node, and including an integration capacitor having a first end coupled to the input node, and a second end, first and second transistors adapted to be connected in series between first and second reference potentials, a first common node between the first and second transistors being coupled to the second end of the integration capacitor, each of the first and second transistors having a control end, and a sampling and holding unit coupled between the first common node and the output node for sampling and holding a voltage at the first common node; and a switch unit adapted to be connected between third and fourth reference potentials, and connected electrically to the control ends of the first and second transistors and the input node of the read-out circuit.

The switch unit is operable between a first state, where the control ends of the first and second transistors are coupled respectively to the input node and the fourth reference potential through the switch unit such that the first detection current from the detector unit is read out by the read-out circuit, and a second state, where the control ends of the first and second transistors are coupled respectively to the third reference potential and the input node through the switch unit such that the second detection current from the detector unit is read out by the read-out circuit.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
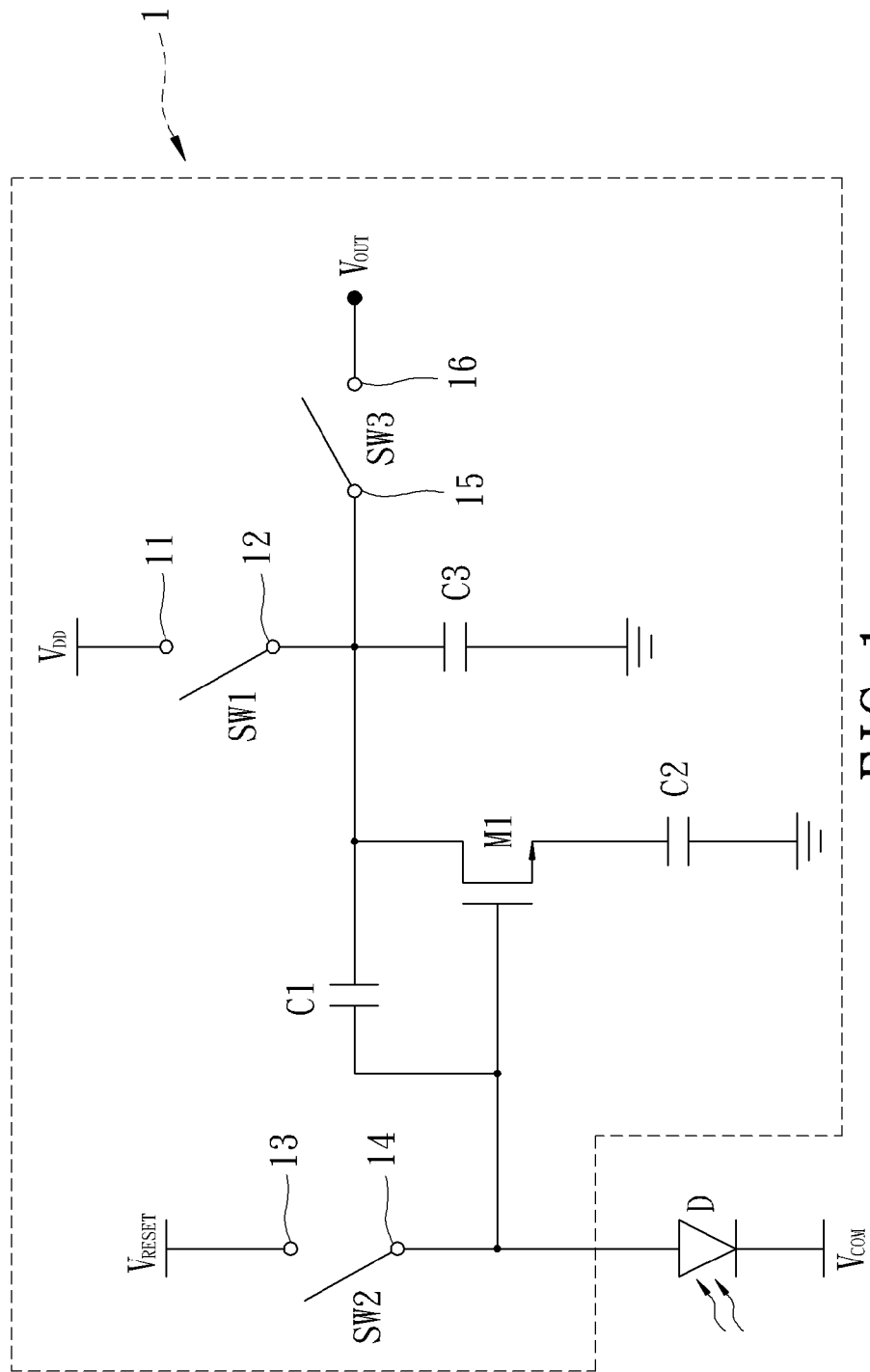
FIG. 1 is a schematic electrical circuit diagram illustrating a conventional capacitive transimpedance amplifier for a photovoltaic infrared detector.
Figure 2:
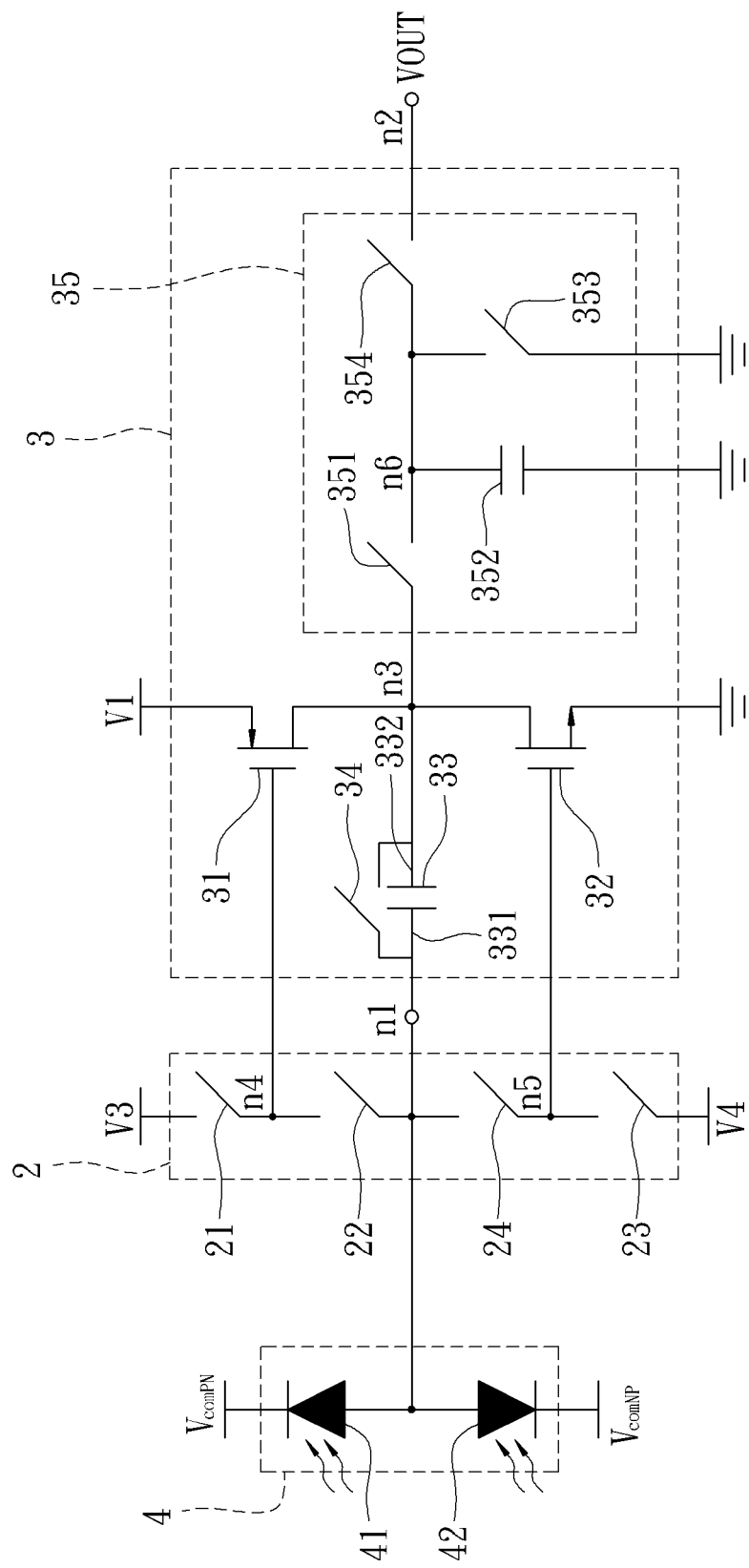
FIG. 2 is a schematic electrical circuit diagram illustrating the preferred embodiment of a read-out device according to the present invention.

Referring to FIG. 2, the preferred embodiment of a read-out device according to the present invention is shown to include a detector unit 4, a switch unit 2, and a read-out circuit 3, wherein the switch unit 2 and the read-out circuit 3 constitute a dual-mode capacitive transimpedance amplifier operable between a first mode and a second mode.

Figure 3:
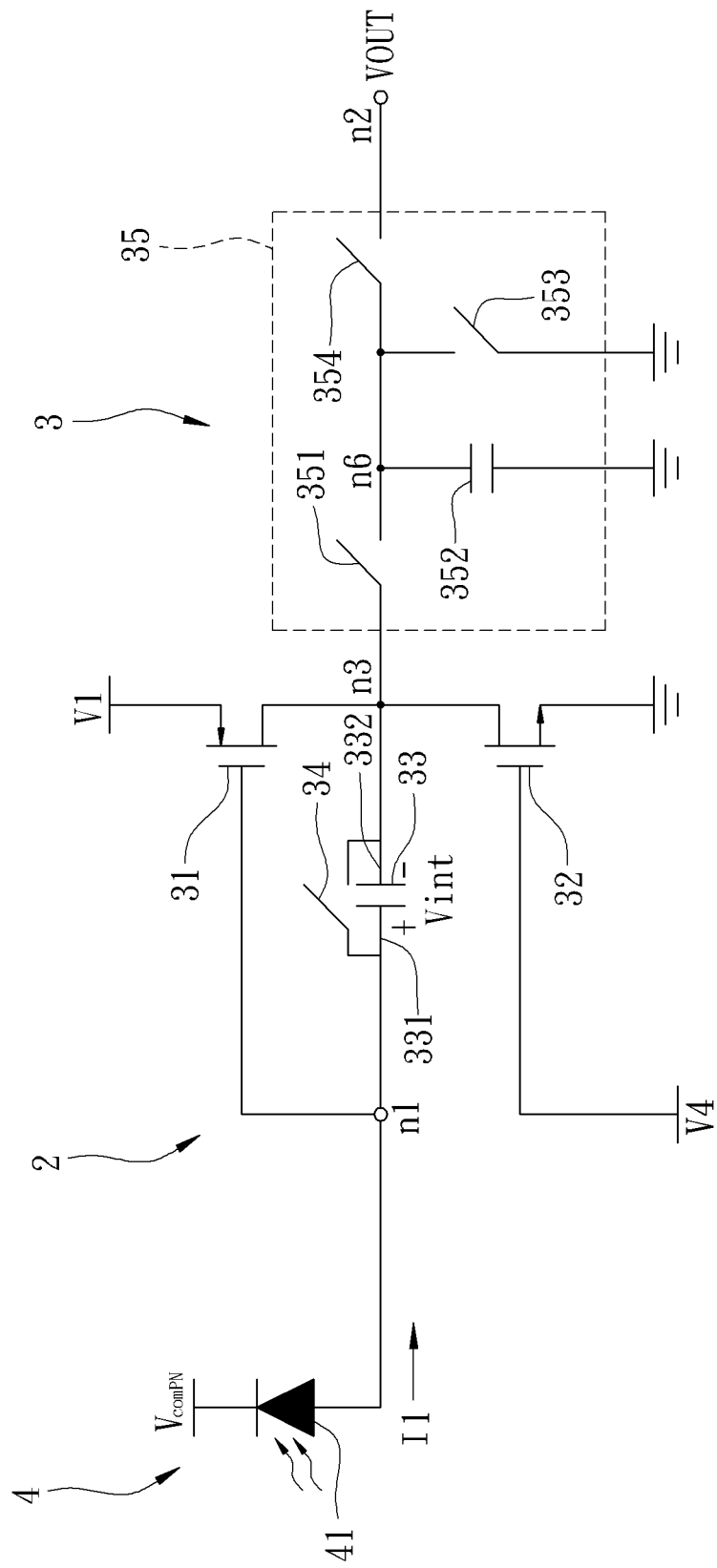
FIG. 3 is an equivalent circuit diagram illustrating the preferred embodiment when a capacitive transimpedance amplifier is operated in a first mode.
Figure 4:
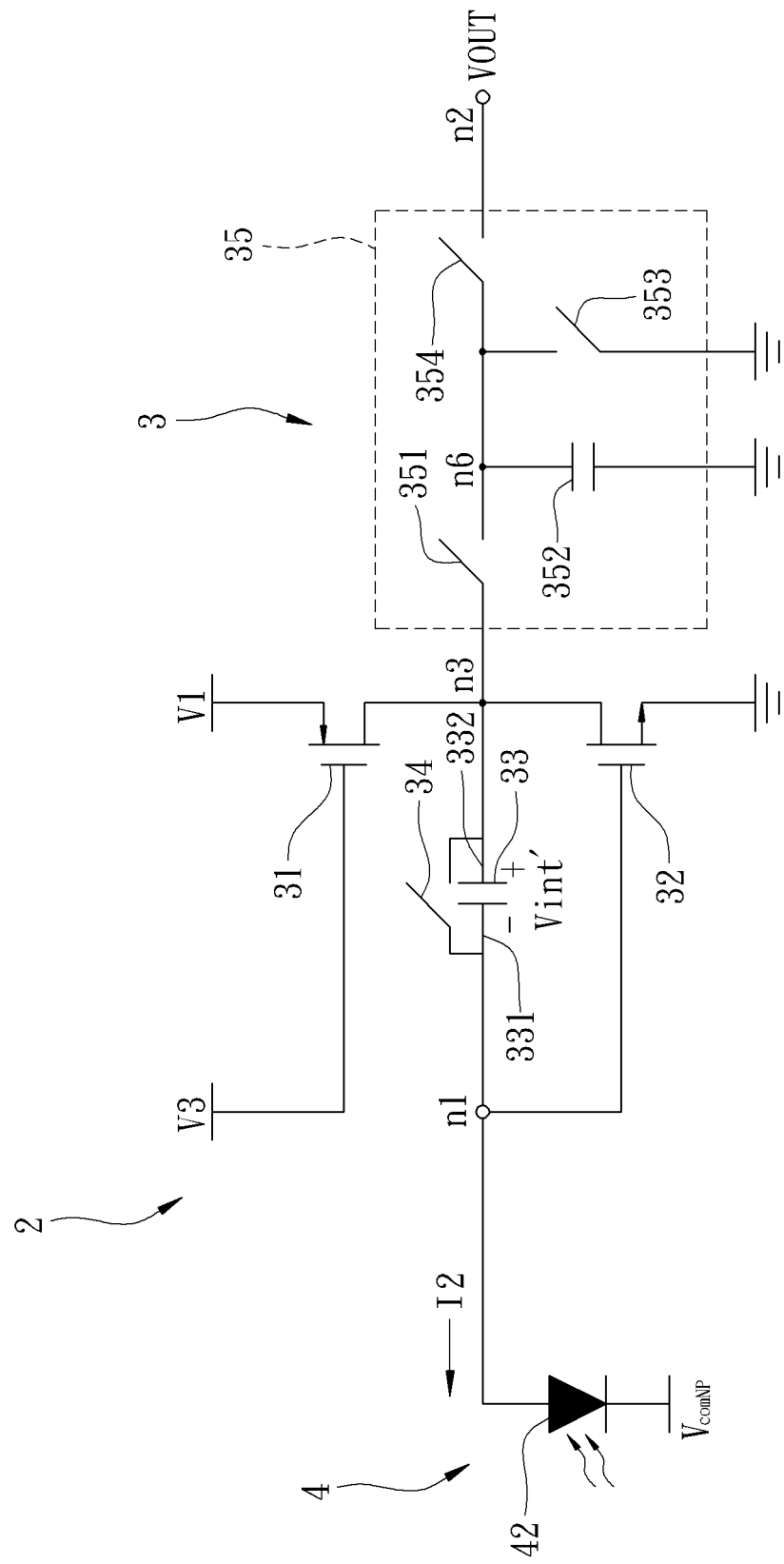
FIG. 4 is an equivalent circuit diagram illustrating the preferred embodiment when the capacitive transimpedance amplifier is operated in a second mode.
Figure 5:
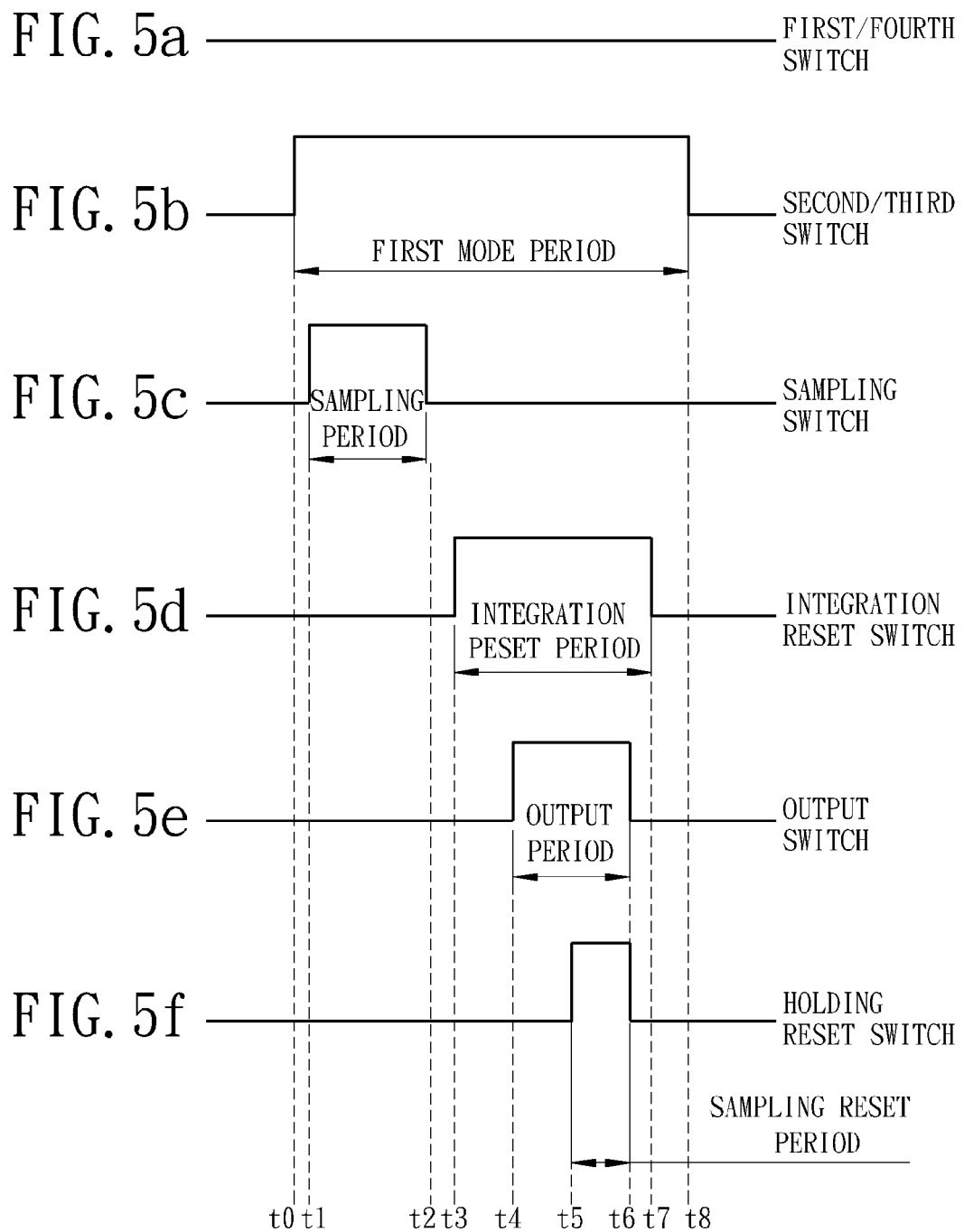
FIG. 5a is a timing diagram illustrating operation of first and fourth switches of a switch unit of the preferred embodiment during the first mode of the capacitive transimpedance amplifier.
FIG. 5b is a timing diagram illustrating operation of second and third switches of the switch unit of the preferred embodiment during the first mode of the capacitive transimpedance amplifier.
FIG. 5c is a timing diagram illustrating operation of a sampling switch of the preferred embodiment during the first mode of the capacitive transimpedance amplifier.
FIG. 5d is a timing diagram illustrating operation of an integration reset switch of the preferred embodiment during the first mode of the capacitive transimpedance amplifier.
FIG. 5e is a timing diagram illustrating operation of an output switch of the preferred embodiment during the first mode of the capacitive transimpedance amplifier.
FIG. 5f is a timing diagram illustrating operation of a holding reset switch of the preferred embodiment during the first mode of the capacitive transimpedance amplifier.
Figure 6:
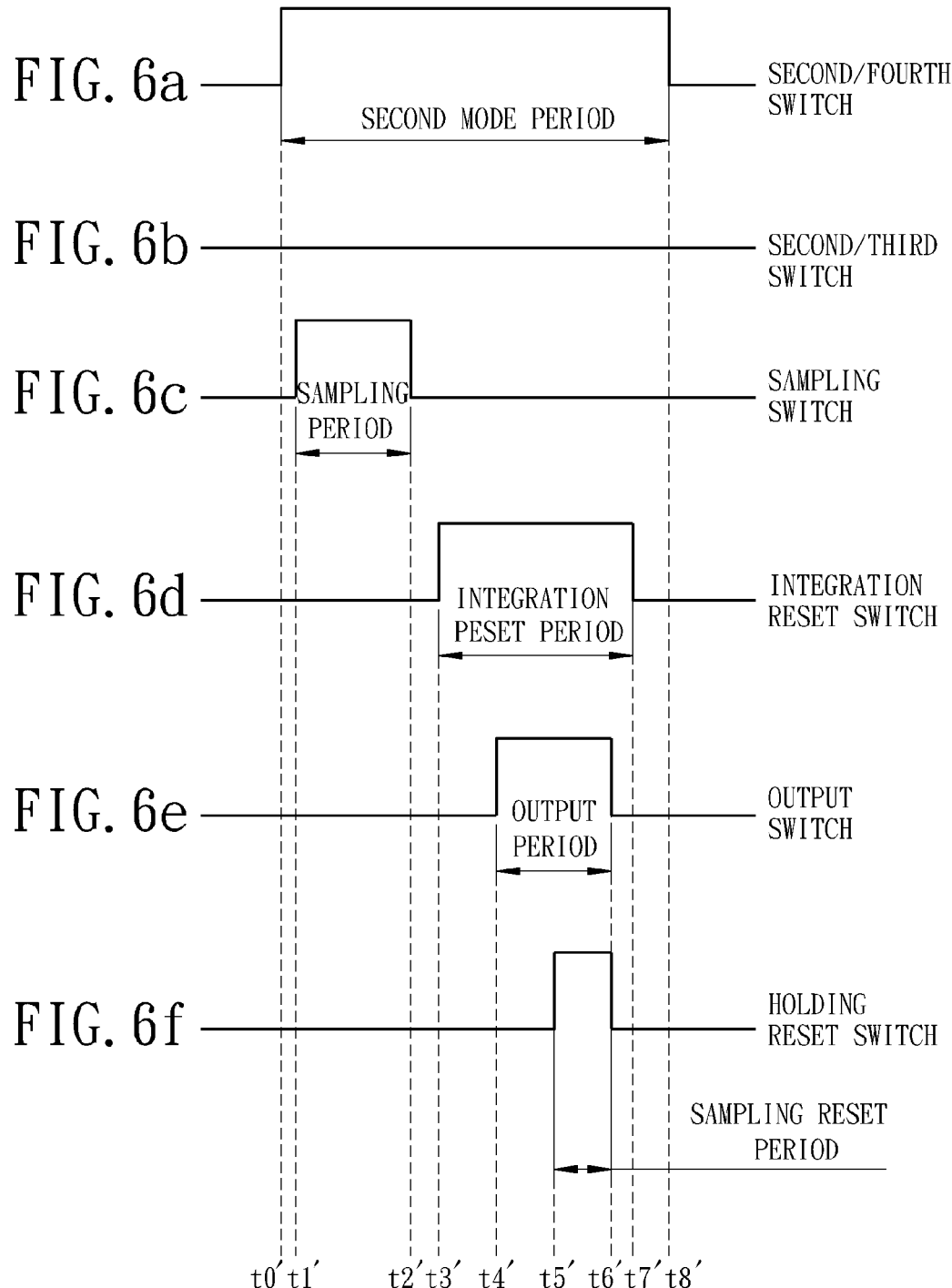
FIG. 6a is a timing diagram illustrating operation of the first and fourth switches of the preferred embodiment during the second mode of the capacitive transimpedance amplifier.
FIG. 6b is a timing diagram illustrating operation of the second and third switches of the preferred embodiment during the second mode of the capacitive transimpedance amplifier.
FIG. 6c is a timing diagram illustrating operation of the sampling switch of the preferred embodiment during the second mode of the capacitive trans impedance amplifier.
FIG. 6d is a timing diagram illustrating operation of the integration reset switch of the preferred embodiment during the second mode of the capacitive transimpedance amplifier.
FIG. 6e is a timing diagram illustrating operation of the output switch of the preferred embodiment during the second mode of the capacitive transimpedance amplifier.
FIG. 6f is a timing diagram illustrating operation of the holding reset switch of the preferred embodiment during the second mode of the capacitive trans impedance amplifier.

The detector unit 4 is capable of generating first and second detection currents flowing respectively in opposite directions. In this embodiment, the detector unit 4 includes a first photovoltaic diode 41 and a second photovoltaic diode 42. The first photovoltaic diode 41 has an anode, and a cathode adapted to be connected to a reverse reference bias ($V_{comPN}$), for example 3.52V, serving as a fifth reference potential. The first photovoltaic diode 41 is operable to generate a first photovoltaic current (I1) in response to incident infrared light. The first photovoltaic current (I1) flows out from the anode of the first photovoltaic diode 41, as shown in FIG. 3, and serves as the first detection current. The second photovoltaic diode 41 has an anode coupled to the anode of the first photovoltaic diode 41, and a cathode adapted to be connected to a forward reference bias ($V_{comNP}$) for example 0.84V, serving as a sixth reference potential. The second photovoltaic diode 42 is operable to generate a second photovoltaic current (I2) in response to incident infrared light. The second photovoltaic current (I2) flows into the anode of the second photovoltaic diode 42, as shown in FIG. 4, and serves as the second detection current.

The read-out circuit 5 has an input node (n1) connected electrically to the anodes of the first and second photovoltaic diodes 41, 42 of the detector unit 4, and an output node (n2). In this embodiment, the read-out circuit 5 includes an integration capacitor 33, first and second transistors 31, 32, an integration reset switch 34, and a sampling and holding unit 35.

The integration capacitor 33 has a first end 331 coupled to the input node (n1), and a second end 332.

The first and second transistors 31, 32 are adapted to be connected in series between a first reference potential (V1), for example 5V, and a ground potential serving as a second reference potential. In other embodiments, the second reference potential can be another reference potential different from the ground potential. A first common node (n3) between the first and second transistors is coupled to the second end 332 of the integration capacitor 33. Each of the first and second transistors 31, 32 has a control end. In this embodiment, the first transistor 31 is a P-type field effect transistor that has a source adapted to be connected to the first reference potential (V1), a drain coupled to the first common node (n3), and a gate serving as the control end of the first transistor 31. The second transistor is an N-type field effect transistor that has a source adapted to be connected to the ground potential, a drain coupled to the first common node (n3), and a gate serving as the control end of the second transistor 32.

The integration reset switch 34 is connected across the integration capacitor 33.

The sampling and holding unit 35 is coupled between the first common node (n3) and the output node (n3) for sampling and holding a voltage the first common node (n3). In this embodiment, the sampling and holding unit 35 includes a series connection of a sampling switch 351 and a holding capacitor 352, a holding reset switch 353, and an output switch 354. The sampling switch 351 is coupled to the first common node (n3). The holding capacitor is adapted to be connected to the ground potential. The holding reset switch 353 is connected across the holding capacitor 352 such that the holding capacitor 352 discharges to a zero charge level when the holding reset switch 353 conducts. The output switch 354 is coupled between the output node (n2), and a common node (n6) between the sampling switch 351 and the holding capacitor 352.

The switch unit 2 is adapted to be connected between a third reference potential (V3), for example 3.4V, and a fourth reference potential (V4), for example 0.91V, and is connected electrically to the control ends of the first and second transistors 31, 32 and the input node (n1) of the read-out circuit 3. The switch unit 2 is operable between a first state and a second state. In the first state, the control ends of the first and second transistors 31, 32 are coupled respectively to the input node (n1) and the fourth reference potential (V4) through the switch unit 2, as shown in FIG. 3, such that the first photovoltaic current (I1), i.e., first detection current, from the detector unit 4 is read out by the read-out circuit 3. In the second state, the control ends of the first and second transistors 31, 32 are coupled respectively to the third reference potential (V3) and the input node (n1) such that the second photovoltaic current (I2), i.e., the second detection current, from the detector unit 4 is read out by the read-out circuit 3. In this embodiment, the switch unit 2 includes a series connection of first and second switches 21, 22, and a series connection of third and fourth switches 23, 24. The first and second switches 21, 22 are connected respectively to the third reference potential (V3) and the input node (n1) of the read-out circuit 3. A second common node (n4) between the first and second switches 21, 22 is coupled to the control end of the first transistor 31. The third and fourth switches 23, 24 are connected respectively to the fourth reference potential (V4) and the input node (n1) of the read-out circuit 3. A third common node (n5) between the third and fourth switches 23, 24 is coupled to the control end of the second transistor 32 of the read-out circuit 3.

When the first photovoltaic current (I1) is generated from the detector unit 4, the dual-mode capacitive transimpedance amplifier is operated in the first mode. In this case, the switch unit 2 is operated in the first state. When the second photovoltaic current (I2) is generated from the detector unit 4, the dual-mode capacitive transimpedance amplifier is operated in the second mode, In this case, the switch unit 2 is operated in the second state.

Referring further to FIGS. 3, and 5a to 5f, the dual-mode capacitive transimpedance amplifier is operated in the first mode during a first mode period from t0 to t8. During the first mode period, the first and fourth switches 21, 24 of the switch unit 2 do not conduct (see FIG. 5a) while the second and third switches 22, 23 conduct (see FIG. 5b). In this case, the control ends of the first and second transistors 31, 32 are respectively connected to the input node (n1) and the fourth reference potential (V4) through the switch unit 2 such that the second transistor 32 is operated as an active load for providing a current path. At the beginning of the first mode of the dual-mode capacitive transimpedance amplifier, the first and second ends 331, 332 of the integration capacitor 33 have the same potential such that the integration capacitor 33 is charged from a zero charge level with the first photovoltaic current (I1) for an integration time period (T). Therefore, the potential at the second end 332 of the integration capacitor 3 gradually reduces such that a voltage (Vint) across the integration capacitor 33 is obtained according the following Equation:

$$Vint = \frac{1}{Cint}\int_0^T I(t)\,dt$$

where Cint represents the capacitance of the integration capacitor 33, and I(t) represents the first photovoltaic current (I1). In this case, the sampling switch 351 of the sampling and holding unit 35 conducts during a sampling period from t1 to t2 (see FIG. 5c) such that the holding capacitor 352 is charged with a current through the first transistor 31 until the potential at the common node (n6) is identical to the potential at the first common node (n3). Then, the integration reset switch 34 conducts during a predetermined integration reset period from t3 to t7 (see FIG. 5d) for reset operation of the integration capacitor 33. During the predetermined integration reset period, the output switch 354 of the sampling and holding unit 35 conducts during an output period from t4 to t6 (see FIG. 5e) such that the voltage across the holding capacitor 352 serves as an output voltage and is output at the output node (n2). After outputting the output voltage, the holding reset switch 353 conducts during a holding reset period from t5 to t6 such that the voltage across the holding capacitor 352 is reset to zero.

Referring further to FIGS. 4, and 6a to 6f, the dual-mode capacitive transimpedance amplifier is operated in the second mode during a second mode period from t0' to t8'. Similarly, during the second mode period, the first and fourth switches 21, 24 of the switch unit 2 conduct (see FIG. 6a) while the second and third switches 22, 23 do not conduct (see FIG. 6b) such that the control ends of the first and second transistors 31, 32 are respectively connected to the third reference potential and the input node (n1). In this case, the first transistor 31 is operated as an active load for providing a current path. At the beginning of the second mode of the dual-mode capacitive transimpedance amplifier, the first and second ends 331, 332 of the integration capacitor 33 have the same potential such that the integration capacitor 33 is charged from a zero charge level with the second photovoltaic current (I2) for an integration time period (T'). Therefore, the potential at the second end 332 of the integration capacitor 3 gradually rises such that a voltage (Vint') across the integration capacitor 33 is obtained according the following Equation:

$$Vint' = \frac{1}{Cint}\int_0^{T'} I'(t)\,dt$$

where Cint represents the capacitance of the integration capacitor 33, and I' (t) represents the second photovoltaic current (I2). In this case, the sampling switch 351 of the sampling and holding unit 35 conducts during a sampling period from t1' to t2' (see FIG. 6c) such that the holding capacitor 352 is charged with a current through the first transistor 31 until the potential at the common node (n6) is identical to the potential at the first common node (n3). Then, the integration reset switch 34 conducts during a predetermined integration reset period from t3' to t7' (see FIG. 6d) for reset operation of the integration capacitor 33. During the predetermined integration reset period, the output switch 354 of the sampling and holding unit 35 conducts during an output period from t4' to t6' (see FIG. 6e) such that the voltage across the holding capacitor 352 serves as an output voltage and is output at the output node (n2). After outputting the output voltage, the holding reset switch 353 conducts during a holding reset period from t5' to t6' such that the voltage across the holding capacitor 352 is reset to zero.

In sum, due to the presence of the dual-mode capacitive transimpedance amplifier, the read-out device of the present invention can read alternately out the first and second detection currents (I1, I2). In addition, the voltage across the holding capacitor 352 is obtained through charging the holding capacitor 352 by the voltage across the integration capacitor 33. As such, the voltage across the integration capacitor 33 is directly reflected in the output voltage (VOUT) without voltage division operation required in the prior art. Therefore, the sizes of the integration capacitor 33 and the holding capacitor 352 can be reduced, thereby greatly decreasing the circuitry area of the dual-mode capacitive transimpedance amplifier.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A capacitive transimpedance amplifier for a detector unit capable of generating first and second detection currents flowing respectively in opposite directions, said capacitive transimpedance amplifier comprising:
    a read-out circuit having an input node adapted to be connected electrically to the detector unit, and an output node, and including
        an integration capacitor having a first end coupled to said input node, and a second end,
        first and second transistors adapted to be connected in series between first and second reference potentials, a first common node between said first and second transistors being coupled to said second end of said integration capacitor, each of said first and second transistors having a control end, and
        a sampling and holding unit coupled between said first common node and said output node for sampling and holding a voltage at said first common node; and
    a switch unit adapted to be connected between third and fourth reference potentials, and connected electrically to said control ends of said first and second transistors and said input node of said read-out circuit;
    wherein said switch unit is operable between a first state, where said control ends of said first and second transistors are coupled respectively to said input node and the fourth reference potential through said switch unit such that the first detection current from the detector unit is read out by said read-out circuit, and a second state, where said control ends of said first and second transistors are coupled respectively to the third reference potential and said input node through said switch unit such that the second detection current from the detector unit is read out by said read-out circuit.

2. The capacitive transimpedance amplifier as claimed in claim 1, wherein said switch unit includes
    a series connection of first and second switches, which are connected respectively to the third reference potential and said input node of said read-out circuit, a second common node between said first and second switches being coupled to said control end of said first transistor of said read-out circuit, and
    a series connection of third and fourth switches, which are connected respectively to the fourth reference potential and said input node of said read-out circuit, a third common node between said third and fourth switches being coupled to said control end of said second transistor of said read-out circuit;
    wherein, when said switch unit is operated in the first state, said second and third switches conduct while said first and fourth switches do not conduct; and wherein, when said switch unit is operated in the second state, said first and fourth switches conduct while said second and third switches do not conduct.

3. The capacitive transimpedance amplifier as claimed in claim 1, wherein:
    said first transistor is a P-type field effect transistor that has a source adapted to be connected to the first reference potential, a drain coupled to said first common node, and a gate serving as said control end of said first transistor; and
    said second transistor is an N-type field effect transistor that has a source adapted to be connected to the second reference potential, a drain coupled to said first common node, and a gate serving as said control end of said second transistor.

4. The capacitive transimpedance amplifier as claimed in claim 1, wherein said read-out circuit further includes an integration reset switch connected across said integration capacitor.

5. The capacitive transimpedance amplifier as claimed in claim 1, wherein said sampling and holding unit of said read-out circuit includes a series connection of a sampling switch coupled to said first common node, and a holding capacitor adapted to be connected to the second reference potential.

6. The capacitive transimpedance amplifier as claimed in claim 5, wherein said sampling and holding unit of said read-out circuit further includes a holding reset switch connected across said holding capacitor.

7. The capacitive transimpedance amplifier as claimed in claim 5, wherein said sampling and holding unit of said read-out circuit further includes an output switch coupled between said output node, and a common node between said sampling switch and the holding capacitor.

8. A read-out device comprising:
    a detector unit capable of generating first and second detection currents flowing respectively in opposite directions;
    a read-out circuit having an input node connected electrically to said detector unit, and an output node, and including
        an integration capacitor having a first end coupled to said input node, and a second end,
        first and second transistors adapted to be connected in series between first and second reference potentials, a first common node between said first and second transistors being coupled to said second end of said integration capacitor, each of said first and second transistors having a control end, and
        a sampling and holding unit coupled between said first common node and said output node for sampling and holding a voltage at said first common node; and
    a switch unit adapted to be connected between third and fourth reference potentials, and connected electrically to said control ends of said first and second transistors and said input node of said read-out circuit;
    wherein said switch unit is operable between a first state, where said control ends of said first and second transistors is coupled respectively to said input node and the fourth reference potential through said switch unit such that the first detection current from said detector unit is read out by said read-out circuit, and a second state, where said control ends of said first and second transistors are coupled respectively to the third reference potential and said input node through said switch unit such that the second detection current from said detector unit is read out by said read-out circuit.

9. The read-out device as claimed in claim 8, wherein said switch unit includes
   a series connection of first and second switches, which are connected respectively to the third reference potential and said input node of said read-out circuit, a second common node between said first and second switches being coupled to said control end of said first transistor of said read-out circuit, and
   a series connection of third and fourth switches, which are connected respectively to the fourth reference potential and said input node of said read-out circuit, a third common node between said third and fourth switches being coupled to said control end of said second transistor of said read-out circuit;
   wherein, when said switch unit is operated in the first state, said second and third switches conduct while said first and fourth switches do not conduct; and
   wherein, when said switch unit is operated in the second state, said first and fourth switches conduct while said second and third switches do not conduct.

10. The read-out device as claimed in claim 8, wherein:
   said first transistor is a P-type field effect transistor that has a source adapted to be connected to the first reference potential, a drain coupled to said first common node, and a gate serving as said control end of said first transistor; and
   said second transistor is an N-type field effect transistor that has a source adapted to be connected to the second reference potential, a drain coupled to said first common node, and a gate serving as said control end of said second transistor.

11. The read-out device as claimed in claim 8, wherein said read-out circuit further includes integration reset switch connected across said integration capacitor.

12. The read-out device as claimed in claim 8, wherein said sampling and holding unit of said read-out circuit includes a series connection of a sampling switch coupled to said first common node, and a holding capacitor adapted to be connected to the second reference potential.

13. The read-out device as claimed in claim 12, wherein said sampling and holding unit of said read-out circuit further includes a holding reset switch connected across said holding capacitor.

14. The read-out device as claimed in claim 12, wherein said sampling and holding unit of said read-out circuit further includes an output switch coupled between said output node, and a common node between said sampling switch and the holding capacitor.

15. The read-out device as claimed in claim 8, wherein said detector unit includes:
   a first photovoltaic diode having an anode coupled to said input node and a cathode adapted to be connected to a fifth reference potential, and operable to generate a first photovoltaic current in response to incident infrared light, the first photovoltaic current flowing from said anode of said first photovoltaic diode to said input node and serving as the first detection current; and
   a second photovoltaic diode having an anode coupled to said input node and a cathode adapted to be connected to a sixth reference potential lower than the fifth reference potential, and operable to generate a second photovoltaic current in response to incident infrared light, the second photovoltaic current flowing from said input node to said anode of said second photovoltaic diode and serving as the second detection current.

\* \* \* \* \*